(12) United States Patent
Oh et al.

(10) Patent No.: US 9,201,114 B2
(45) Date of Patent: Dec. 1, 2015

(54) SEMICONDUCTOR INTEGRATED CIRCUIT AND METHOD FOR MEASURING INTERNAL VOLTAGE THEREOF

(75) Inventors: Sang-Mook Oh, Gyeonggi-do (KR); Jae-Hyuk Im, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 384 days.

(21) Appl. No.: 13/609,752

(22) Filed: Sep. 11, 2012

(65) Prior Publication Data

US 2014/0002120 A1 Jan. 2, 2014

(30) Foreign Application Priority Data

Jun. 29, 2012 (KR) .................. 10-2012-0071257

(51) Int. Cl.
*G01R 31/3187* (2006.01)
*G01R 31/28* (2006.01)
*H01L 23/58* (2006.01)

(52) U.S. Cl.
CPC ............ *G01R 31/2884* (2013.01); *H01L 23/58* (2013.01); *H01L 2224/16145* (2013.01); *H01L 2224/16225* (2013.01); *H01L 2924/15192* (2013.01); *H01L 2924/15311* (2013.01)

(58) Field of Classification Search
CPC .................. H01L 23/58; G01R 31/2884
USPC .................. 324/750.3, 762.01–762.03; 714/733–734
See application file for complete search history.

(56) References Cited

U.S. PATENT DOCUMENTS

| | | | | |
|---|---|---|---|---|
| 5,977,763 | A * | 11/1999 | Loughmiller et al. ..... | 324/750.3 |
| 2001/0005143 | A1* | 6/2001 | Beer et al. ..................... | 324/765 |
| 2006/0152246 | A1* | 7/2006 | Tucker et al. ................. | 326/38 |
| 2007/0181991 | A1* | 8/2007 | Ishino et al. ................. | 257/686 |
| 2009/0003088 | A1* | 1/2009 | Kang ....................... | 365/189.09 |
| 2009/0080279 | A1* | 3/2009 | Kim et al. .................... | 365/226 |
| 2009/0091348 | A1* | 4/2009 | Shin et al. .................... | 324/765 |
| 2009/0125687 | A1* | 5/2009 | Park et al. .................... | 711/154 |
| 2009/0206918 | A1* | 8/2009 | Jung ............................. | 327/538 |
| 2010/0327954 | A1* | 12/2010 | Sakamoto et al. ............ | 327/519 |

FOREIGN PATENT DOCUMENTS

| | | |
|---|---|---|
| KR | 100292702 | 6/2001 |
| KR | 1020040096399 | 11/2004 |

* cited by examiner

*Primary Examiner* — Patrick Assouad
*Assistant Examiner* — Demetrius Pretlow
(74) *Attorney, Agent, or Firm* — IP & T Group LLP

(57) ABSTRACT

A semiconductor integrated circuit includes at least one second semiconductor chip configured to generate an internal voltage, and a first semiconductor chip including a monitoring unit configured to monitor the internal voltage, and a first pad configured to provide monitoring result information outputted from the monitoring unit to a test device.

20 Claims, 10 Drawing Sheets

SEMICONDUCTOR INTEGRATED CIRCUIT AND METHOD FOR MEASURING INTERNAL VOLTAGE THEREOF

CROSS-REFERENCE TO RELATED APPLICATIONS

The present application claims priority of Korean Patent Application No. 10-2012-0071257, filed on Jun. 29, 2012, which is incorporated herein by reference in its entirety.

BACKGROUND

1. Field

Exemplary embodiments of the present invention relate to semiconductor design technology, and more particularly, to a semiconductor integrated circuit having a stack package structure and a method for measuring an internal voltage thereof.

2. Description of the Related Art

In general, packaging technology for semiconductor integrated circuits has been continuously developed to satisfy demands for miniaturization and mounting reliability thereof. As the high performance of electrical and electronic products is requested with the miniaturization of electrical and electronic products, a variety of technologies for a stack package of the semiconductor integrated circuits are being developed.

In the semiconductor industry, "stack" means vertically stacking two or more semiconductor chips or packages. A semiconductor memory device to which a stack package is applied may have a memory capacity two or more times larger than a memory capacity which may be realized in a semiconductor integration process. Furthermore, the stack package not only increases the memory capacity, but also increases mounting density and efficiency of the mounting area. Therefore, the research and development for the stack package are being accelerated.

The stack package may be fabricated by the following methods. First, individual semiconductor chips may be stacked, and then packaged at once. Second, packaged individual semiconductor chips may be stacked. The individual semiconductor chips of the stacked semiconductor package are electrically coupled through metallic wires or through-chip vias (TCVs). The stacked semiconductor package using TCVs has the physical and electrical connection between the semiconductor chips stacked vertically by TCVs formed in the respective semiconductor chips.

FIG. 1 is a diagram illustrating a semiconductor integrated circuit (hereinafter, referred to as 'semiconductor memory') including a plurality of semiconductor chips electrically connected through TCVs.

Referring to FIG. 1, the semiconductor memory 100 includes a first semiconductor chip 101 electrically connected to an external controller (not illustrated), second to fifth semiconductor chips 103, 105, 107, and 109 stacked vertically over the first semiconductor chip 101, and a plurality of first to fourth TCVs 111, 113, 115, and 117 formed by penetrating the second to fifth semiconductor chips 103, 105, 107, and 109, respectively.

The first semiconductor chip 101 is a semiconductor chip to control the second to fifth semiconductor chips 103, 105, 107, and 109 through the first to fourth TCVs 111, 113, 115, and 117 in response to various signals and voltages provided from the external controller, and it may be referred to as a master chip.

The second to fifth semiconductor chips 103, 105, 107, and 109 are semiconductor chips to perform given operations under the control of the first semiconductor chip 101, for example, store and provide data, and it may be referred to as slave chips.

The first to fourth TCVs 111, 113, 115, and 117 are formed of a metal having an excellent conductivity, and it may be referred to as through silicon vias (TSVs).

The semiconductor memory 100 configured in the above-described manner may interface semiconductor chips by transmitting various signals and voltages through the first to fourth TCVs 111, 113, 115, and 117, thereby reducing signal delay and current consumption. Furthermore, since the semiconductor memory 100 may have an improved bandwidth, the operation performance thereof is enhanced.

FIG. 2 illustrates a package structure in which the semiconductor memory 100 of FIG. 1 and the external controller are integrated.

Referring to FIG. 2, the external controller 200 such as a graphics processing unit (GPU) and the semiconductor memory 100 are electrically connected through a connection layer such as an interposer. Substantially, the first semiconductor chip 101 of the semiconductor memory 100 is electrically connected to the external controller 200 and controls the second to fifth semiconductor chips 103, 105, 107, and 109 through communication with the external controller 200.

Meanwhile, after the first to fifth semiconductor chips 101, 103, 105, 107, and 109 are individually fabricated, the semiconductor memory 100 may be completely fabricated through a subsequent packaging operation. In particular, in order to provide the semiconductor memory 100 having an excellent quality without defects, the quality state thereof is checked through a test during each process. In other words, after the first to fifth semiconductor chips 101, 103, 105, 107, and 109 are individually fabricated, the performances of the first to fifth semiconductor chips 101, 103, 105, 107, and 109 are checked through various tests, and the packaging operation is performed only on semiconductor chips which are determined to have no defects.

Here, the test may refer to a probe test. During the probe test, a probe of a test device are electrically connected with a pad provided in a test target chip and exposed to the outside, in order to test various performances of the test target chip.

Before stack packaging, that is, in a wafer state, pads provided in the first to fifth semiconductor chips 101, 103, 105, 107, and 109, respectively, are exposed to the outside. Therefore, a probe test may be performed on each of the first to fifth semiconductor chips 101, 103, 105, 107, and 109. However, after stack packaging, that is, in a package state, only the pad of the first semiconductor chip 101 positioned at the lower-most part is exposed to the outside. Therefore, a probe test may not be performed on each of the second to fifth semiconductor chips 103, 105, 107, and 109. For example, when the semiconductor memory 100 has a structure in which the second to fifth semiconductor chips 103, 105, 107, and 109 individually generate an internal voltage and the generated internal voltages are not shared among the first to fifth semiconductor chips 101, 103, 105, 107, and 109, the internal voltages generated by the second to fifth semiconductor chips 103, 105, 107, and 109, respectively, may not be tested after stack packaging.

FIG. 3 illustrates a semiconductor memory 100 including second to fifth semiconductor chips 103, 105, 107, and 109 each having an internal voltage generation circuit.

Referring to FIG. 3, the second to fifth semiconductor chips 103, 105, 107, and 109 include respective internal voltage generation circuits 103_1, 105_1, 107_1, and 109_1 for generating one or more internal voltages Vol_1 and Vol_2 and one or more pads PD_1 and PD_2 for testing the one or more internal voltages Vol_1 and Vol_2, respectively.

Here, the internal voltages Vol_1 and Vol_2 of the second to fifth semiconductor chips 103, 105, 107, and 109 may be measured through the pads PD_1 and PD_2 exposed to the outside in a wafer state. In a package state as illustrated in FIG. 3, however, since the pads PD_1 and PD_2 are not exposed to the outside, a test may not be performed on each of the second to fifth semiconductor chips 103, 105, 107, and 109.

In short, although the second to fifth semiconductor chips 103, 105, 107, and 109 pass a test in which the internal voltages Vol_1 and Vol_2 thereof are measured in a wafer state, the second to fifth semiconductor chips 103, 105, 107, and 109 may fail in a test in which the internal voltages Vol_1 and Vol_2 thereof are measured in a package state. This is because defects may occur during a stack packaging process due to characteristics of the stack packaging process. Therefore, the internal voltages Vol_1 and Vol_2 are to be retested in a package state. Accordingly, the semiconductor memory 100 is to be capable of testing the internal voltages Vol_1 and Vol_2 generated by the semiconductor chips 103, 105, 107, and 109 in a package stage.

SUMMARY

An embodiment of the present invention is directed to a semiconductor integrated circuit, in which a plurality of semiconductor chips generating a plurality of internal voltages are stacked vertically, testable from the outside for the internal voltages, and a method for measuring the internal voltages.

Another embodiment of the present invention is directed to a semiconductor integrated circuit, in which a plurality of semiconductor chips generating a plurality of internal voltages are stacked vertically, testable from the outside for the internal voltages and having the area minimized, and a method for measuring the internal voltages.

In accordance with an embodiment of the present invention, a semiconductor integrated circuit includes at least one second semiconductor chip configured to generate an internal voltage, and a first semiconductor chip including: a monitoring unit configured to monitor the internal voltage; and a first pad configured to provide monitoring result information outputted from the monitoring unit to a test device.

In accordance with another embodiment of the present invention, a semiconductor integrated circuit includes at least one second semiconductor chip configured to generate different internal voltages and select the different internal voltages in response to an internal voltage select signal, and a first semiconductor chip configured to generate the internal voltage select signal in response to at least one of an address and a command and monitor the selected internal voltage to output result information corresponding to the monitoring result.

In accordance with yet another embodiment of the present invention, a semiconductor integrated circuit includes at least one slave chip configured to generate internal voltages and transmit the internal voltages through a plurality of through chip vias (TCVs) formed by penetrating the slave chip, and a master chip configured to monitor the internal voltages and generate result information corresponding to the monitoring result.

In accordance with still another embodiment of the present invention, a semiconductor integrated circuit includes a first semiconductor chip configured to be selectively connected to an external controller and a test device, and a plurality of second semiconductor chips stacked with the first semiconductor chip and configured to generate internal voltages under a control of the first semiconductor chip, wherein the first semiconductor chip includes: a first pad configured to exchange a first signal with the external controller during a normal mode and receive a reference voltage from the test device during a test mode; a comparison unit configured to compare the reference voltage with the internal voltages provided from the second semiconductor chips during the test mode; a second pad configured to provide an output signal of the comparison unit to the test device during the test mode and exchange a second signal with the external controller during the normal mode; a first path selection unit configured to selectively connect the comparison unit to the first pad in response to a test mode signal; and a second path selection unit configured to selectively connect the comparison unit to the second pad in response to the test mode signal.

In accordance with still another embodiment of the present invention, there is provided a method for measuring an internal voltage of a semiconductor integrated circuit which includes a plurality of semiconductor chips configured to generate respective internal voltages and stacked vertically. The method includes: providing an internal voltage generated by a second semiconductor chip of the semiconductor chips to a first semiconductor chip of the semiconductor chips during a test mode; and comparing the internal voltage provided from the second semiconductor chip to a reference voltage applied from a test device in the first semiconductor chip, and providing result information corresponding to the comparison result to the test device.

DETAILED DESCRIPTION

Figure 1:
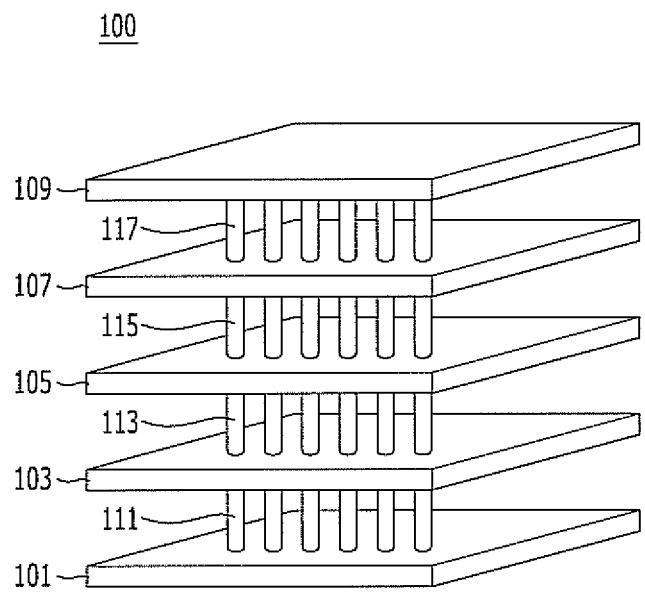
FIG. 1 is a diagram illustrating a semiconductor integrated circuit including a plurality of semiconductor chips electrically connected through TCVs.
Figure 2:
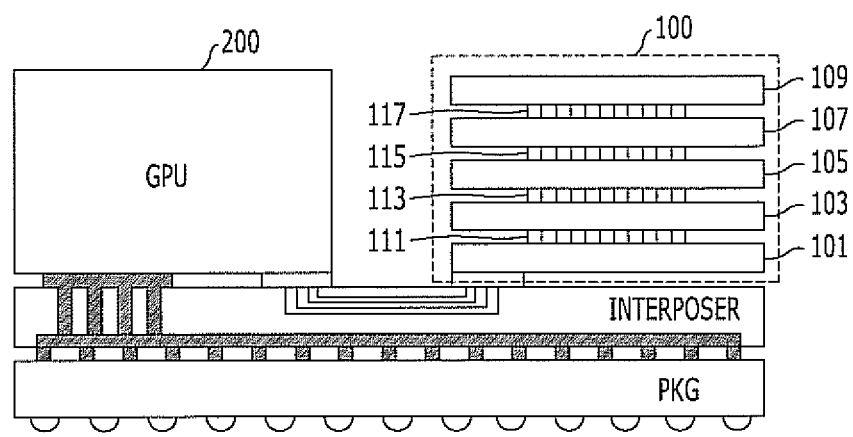
FIG. 2 illustrates a package structure in which the semiconductor memory shown in FIG. 1 and an external controller are integrated.
Figure 3:
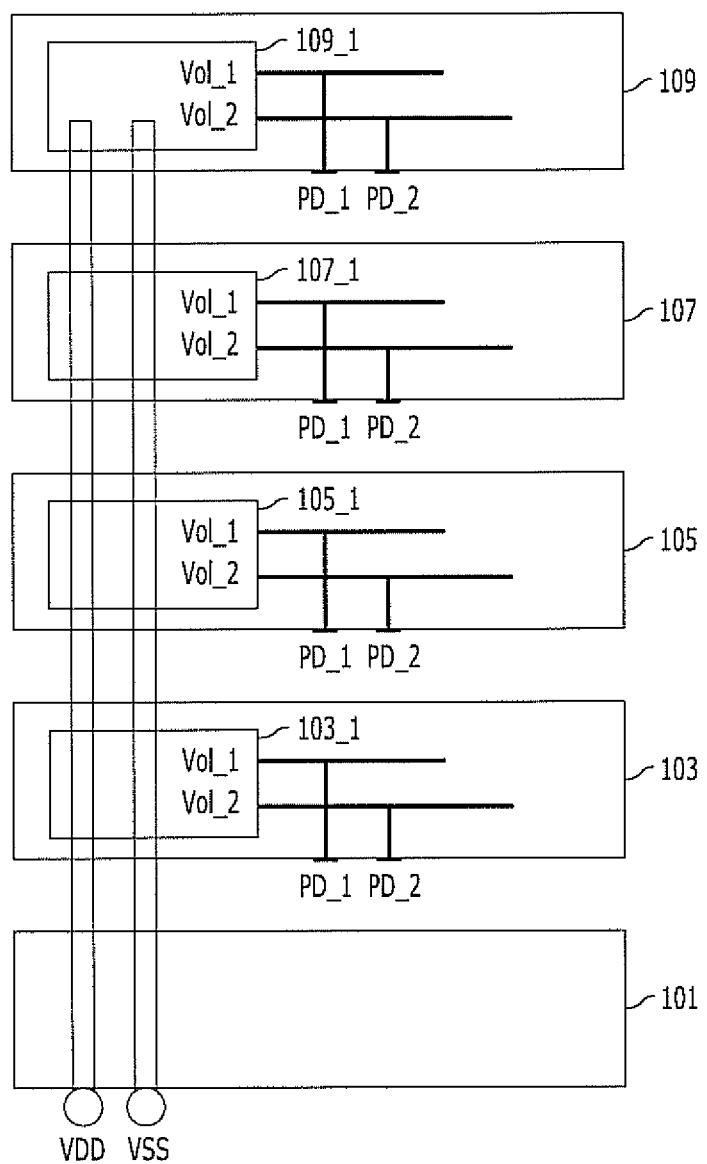
FIG. 3 is a diagram for illustrating the semiconductor memory shown in FIG. 1 including semiconductor chips each having an internal voltage generation circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 4:
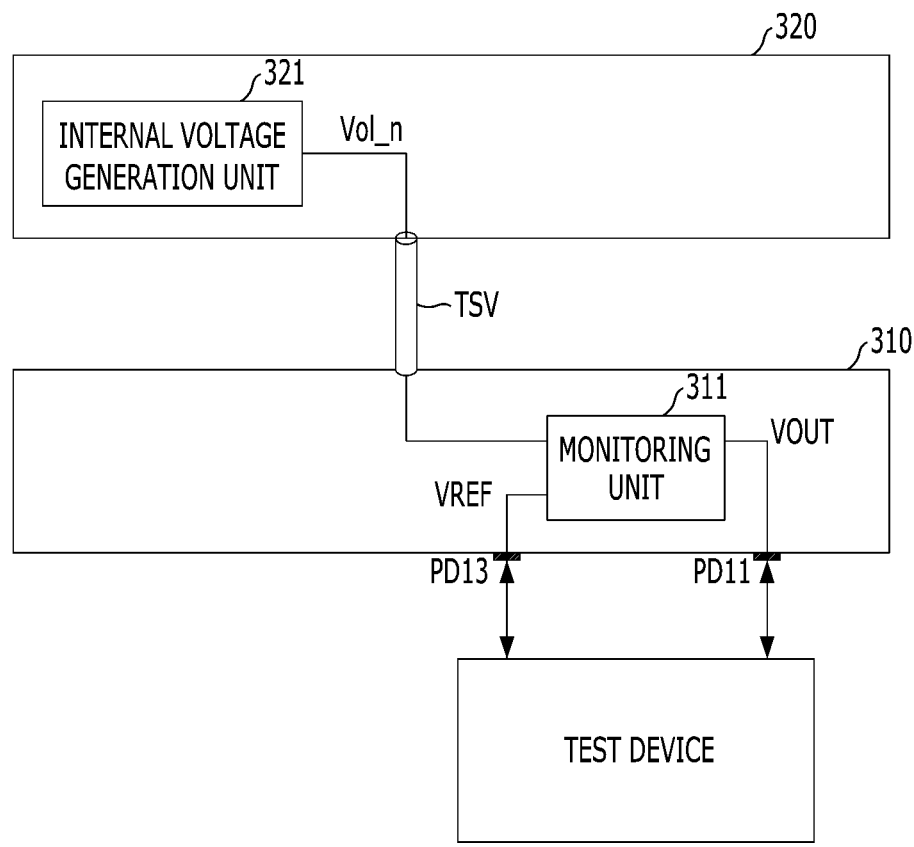
FIG. 4 is a configuration diagram for conceptually illustrating an embodiment of the present invention.

FIG. 4 is a configuration diagram for conceptually illustrating an embodiment of the present invention.

Referring to FIG. 4, a semiconductor integrated circuit 300 includes a master chip 310 electrically connected to a test device (not illustrated) and a slave chip 320 stacked over the master chip 310.

The master chip 310 is a semiconductor chip for controlling the slave chip 320 and includes various logic circuits. In particular, the master chip 310 includes a monitoring unit 311 configured to monitor an internal voltage Vol_n provided from another semiconductor chip, that is, the slave chip 320 and a first pad PD11 configured to provide result information VOUT corresponding to the monitoring result of the monitoring unit 311 to the test device. Here, the monitoring unit 311 includes a comparator configured to compare the internal voltage Vol_n with a reference voltage VREF and output the result information VOUT. In this case, the master chip 310 further includes a second pad PD13 configured to receive the reference voltage VREF from the test device.

The slave chip 320 is a semiconductor chip for performing given operations under the control of the master chip 310 and includes various circuits for performing the given operations. In particular, the slave chip 320 includes an internal voltage generation unit 321 configured to generate the internal voltage Vol_n and a TSV formed to penetrate the slave chip 320 and configured to transmit the internal voltage Vol_n generated from the internal voltage generation unit 321 to the master chip 310.

Hereinafter, semiconductor integrated circuits in accordance with embodiments of the present invention will be described in detail based on the semiconductor integrated circuit 300 illustrated in FIG. 4.

Figure 5:
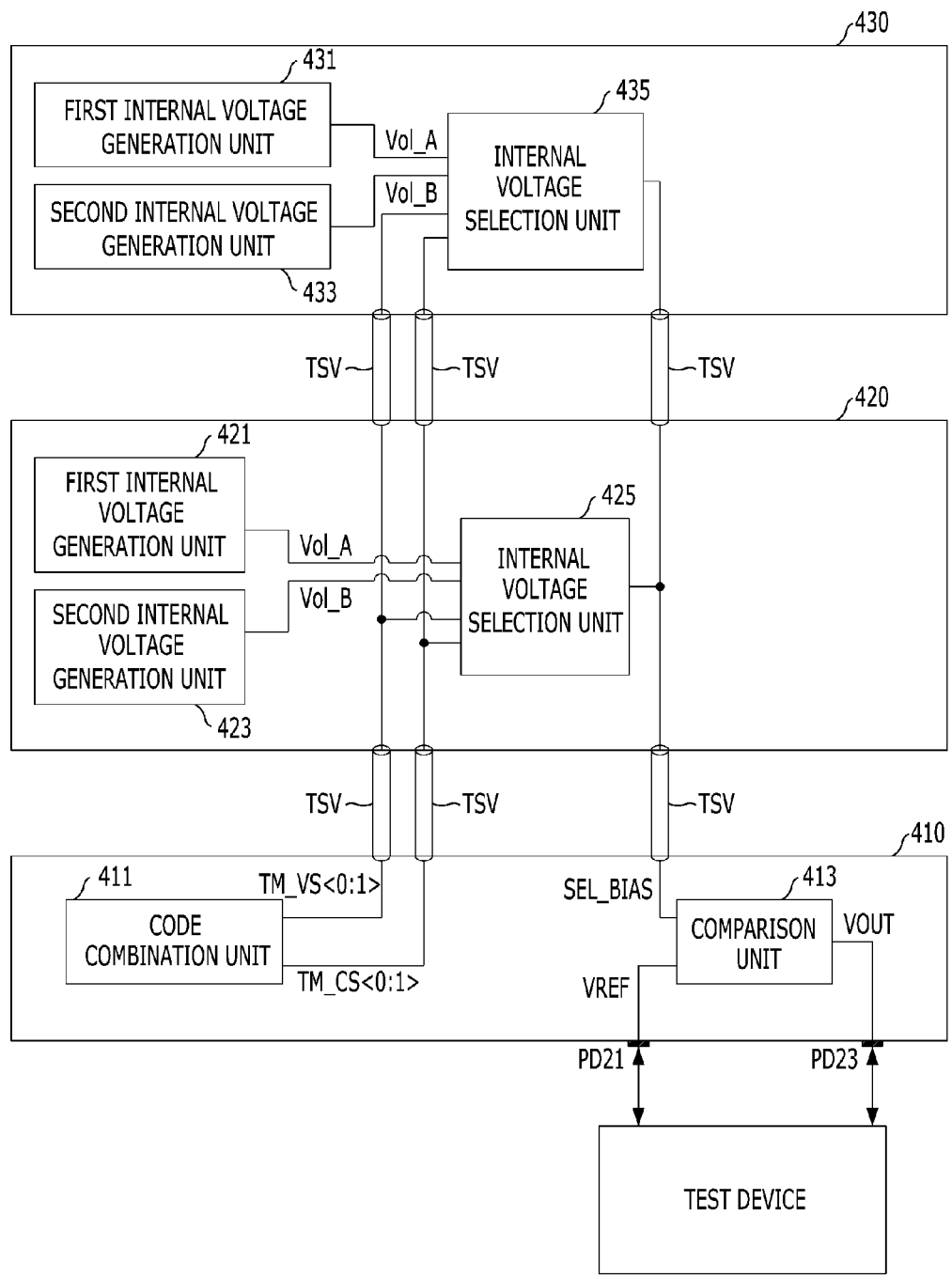
FIG. 5 is a configuration diagram of a semiconductor integrated circuit in accordance with a first embodiment of the present invention.

FIG. 5 is a configuration diagram of a semiconductor integrated circuit in accordance with a first embodiment of the present invention.

For description purposes, it is described as an example that the semiconductor integrated circuit 400 in accordance with the first embodiment of the present invention includes one master chip 410 and two slave chips 420 and 430 stacked vertically over the master chip 410, and each of the slave chips 420 and 430 generates two internal voltages Vol_A and Vol_B. At this time, the semiconductor integrated circuit in accordance with the embodiment of the present invention has a structure in which the internal voltages Vol_A and Vol_B generated by the slave chips 420 and 430 are not shared between the chips. Here, a structure of sharing the internal voltages Vol_A and Vol_B refers to a structure in which the internal voltages generated from the respective chips are connected through a bias mesh or a structure in which an internal voltage is generated from one given chip and then provided to the other chip.

Referring to FIG. 5, the master chip 410 includes a code combination unit 411, a first pad PD21, a comparison unit 413, and a second pad PD23. The code combination unit 411 is configured to generate first and second internal voltage select signals TM_VS<0:1> and first and second chip select signals TM_CS<0:1> by combining at least one of an address and command. The first pad PD21 is configured to receive a reference voltage VREF from a test device. The comparison unit 413 is configured to compare the reference voltage VREF with an internal voltage SEL_BIAS provided from the first or second slave chip 420 or 430 and generate result information VOUT corresponding to the comparison result to the test device. The second pad PD23 is configured to provide the result information VOUT outputted from the comparison unit 413 to the test device.

The first slave chip 420 includes first and second internal voltage generation units 421 and 423 and an internal voltage selection unit 425. The first and second internal voltage generation units 421 and 423 are configured to generate the first and second internal voltages Vol_A and Vol_B, respectively. The internal voltage selection unit 425 is configured to select one of the first and second internal voltages Vol_A and Vol_B generated from the first and second internal voltage generation units 421 and 423 in response to the first and second internal voltage select signals TM_VS<0:1> and provide the selected internal voltage SEL_BIAS to the master chip 410 in response to the first and second chip select signals TM_CS<0:1>. The second slave chip 430 includes first and second internal voltage generation units 431 and 433 and an internal voltage selection unit 435. The first and second internal voltage generation units 431 and 433 are configured to generate the first and second internal voltages Vol_A and Vol_B, respectively. The internal voltage selection unit 435 is configured to select one of the first and second internal voltages Vol_A and Vol_B generated from the first and second internal voltage generation units 431 and 433 in response to the first and second internal voltage select signals TM_VS<0:1> and provide the selected internal voltage SEL_BIAS to the master chip 410 in response to the first and second chip select signals TM_CS<0:1>. Furthermore, each of the first and second slave chips 420 and 430 includes a plurality of TSVs formed vertically therethrough and configured to transmit the first and second internal voltage select signals TM_VS<0:1>, the first and second chip select signals TM_CS<0:1>, and the internal voltage SEL_BIAS.

Figure 6:
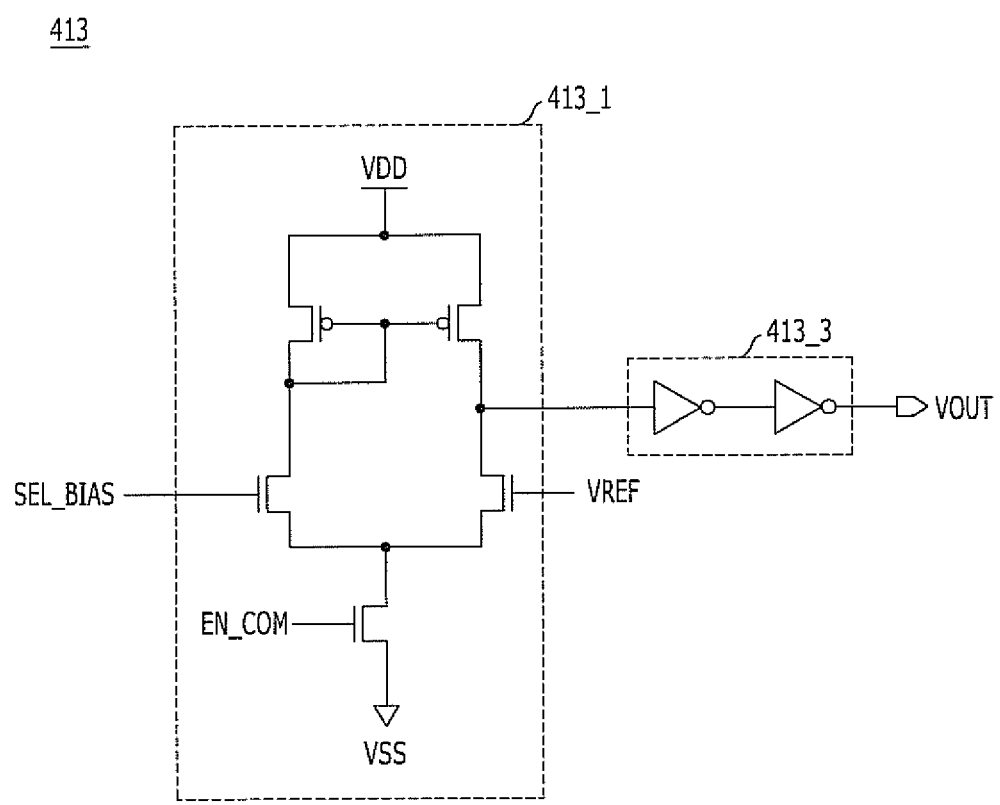
FIG. 6 is an internal circuit diagram of a comparison unit illustrated in FIG. 5.

FIG. 6 is an internal circuit diagram of the comparison unit 413 illustrated in FIG. 5.

Referring to FIG. 6, the comparison unit 413 includes a differential amplification section 413_1 and an output section 413_3. The differential amplification section 413_1 is configured to compare the internal voltage SEL_BIAS with the reference voltage VREF in response to an enable signal EN_COM. The output section 413_3 is configured to output the result information VOUT corresponding to the comparison result of the differential amplification unit 413_1 to the second pad PD23.

Figure 7:
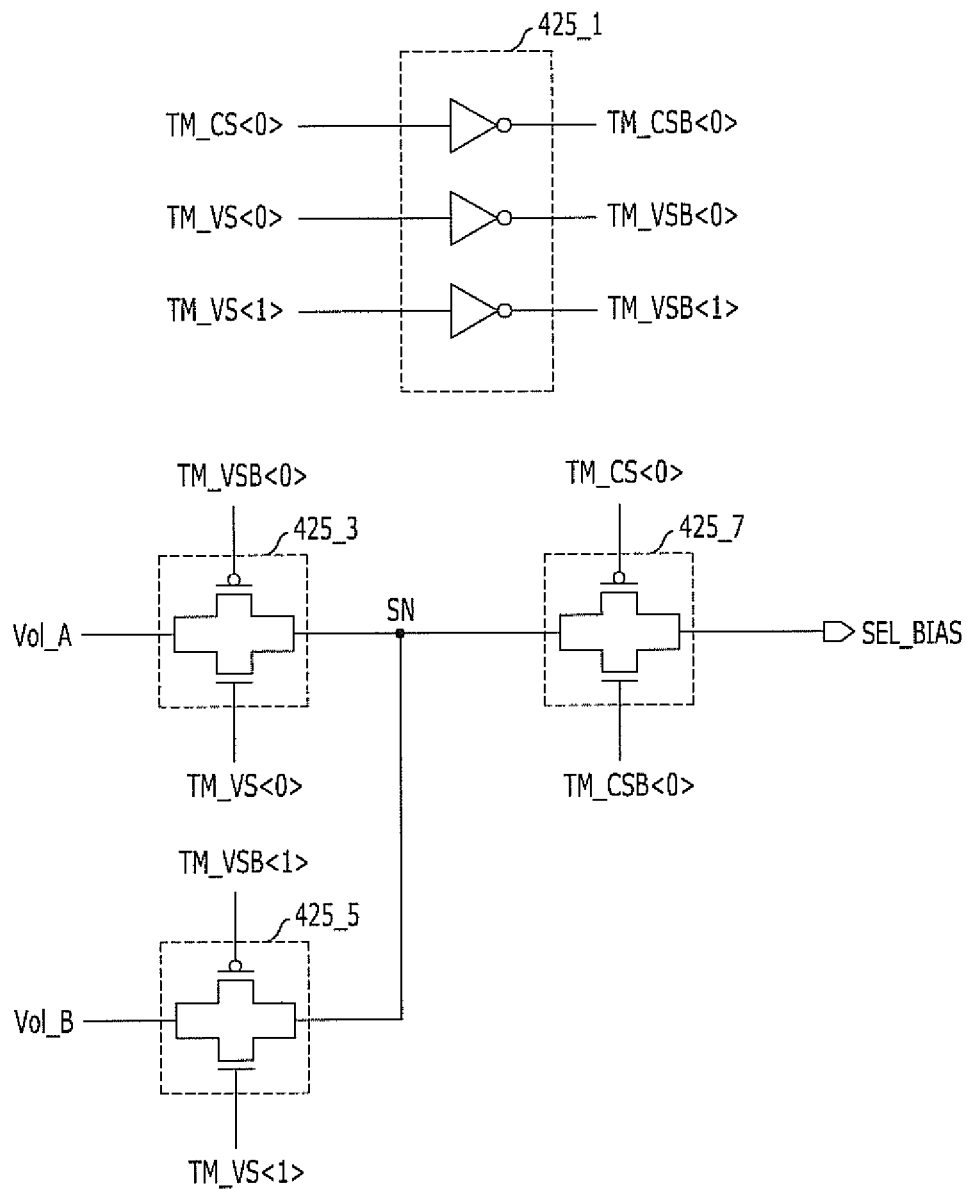
FIG. 7 is an internal circuit diagram of an internal voltage selection unit illustrated in FIG. 5.

FIG. 7 is an internal circuit diagram of the internal voltage selection unit illustrated in FIG. 5. The internal voltage selection unit 425 included in the first slave chip 420 is described as an example.

Referring to FIG. 7, the internal voltage selection unit 425 includes an inverting section 425_1, a first switching section 425_3, a second switching section 425_5, and a third switching section 425_7. The inverting section 425_1 is configured to invert the first chip select signal TM_CS<0> and the first and second internal voltage select signals TM_VS<0:1>. The first switching section 425_3 is configured to transmit the first internal voltage Vol_A to a select node SN in response to the first internal voltage select signal TM_VS<0> and the inverted first internal voltage select signal TM_VSB<0>. The second switching section 425_5 is configured to transmit the second internal voltage Vol_B to the select node SN in response to the second internal voltage select signal TM_VS<1> and the inverted second internal voltage select signal TM_VSB<1>. The third switching section 425_7 is configured to transmit the internal voltage Vol_A or Vol_B transmitted through the select node SN to a corresponding TSV in response to the first chip select signal TM_CS<0> and the inverted first chip select signal TM_CSB<0>. The first to third switching sections 425_3, 425_5, and 425_7 may include transmission gates.

Hereinafter, a method for measuring an internal voltage of the semiconductor integrated circuit 400 in accordance with the first embodiment of the present invention will be described.

When the test device and the master chip 410 are electrically connected during a test mode, the first and second slave chips 420 and 430 generate the first and second internal voltages Vol_A and Vol_B using external voltages VDD and VSS transmitted through the master chip 410.

The code combination unit 411 generates the first and second internal voltage select signals TM_VS<0:1> and the first and second chip select signals TM_CS<0:1> through a combination using at least one of an address and command.

Then, the internal voltage selection unit 425 or 435 included in one of the first and second slave chips 420 and 430 is selected in response to the first and second chip select signals TM_CS<0:1>, and the selected internal voltage selection unit 425 or 435 selects one of the first and second internal voltages Vol_A and Vol_B in response to the first and second internal voltage select signals TM_VS<0:1> and provides the selected internal voltage to the master chip 410 through a corresponding TSV.

Accordingly, the comparison unit 413 included in the master chip 410 compares the internal voltage SEL_BIAS provided from the first or second slave chip 420 or 430 with the reference voltage VREF applied from the test device and provides the result information VOUT corresponding to the comparison result to the test device.

At this time, the reference voltage VREF applied from the test device increases or decreases by a given level within a given critical range. For example, when the reference voltage VREF decreases in a stepwise manner from a given maximum level to a given minimum level, the comparison unit 413 continuously compares the internal voltage SEL_BIAS with the reference voltage VREF. As the comparison result, when the internal voltage SEL_BIAS becomes higher than the reference voltage VREF, the comparison unit 413 outputs the result information VOUT at a high level from a low level. Here, when the result information VOUT transits from a low level to a high level, the reference voltage level VREF may correspond to the voltage level of the internal voltage SEL_BIAS.

Figure 8A:
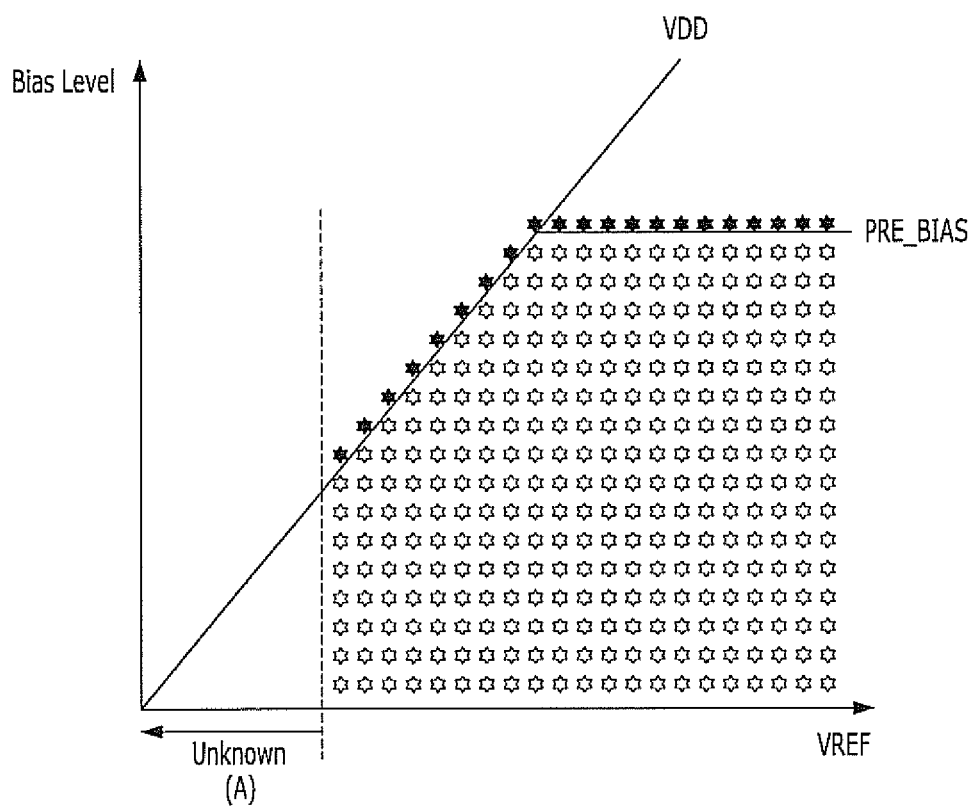
FIGS. 8A and 8B are graphs for illustrating an operation of the comparison unit in the semiconductor integrated circuit in accordance with the first embodiment of the present invention.
Figure 8B:
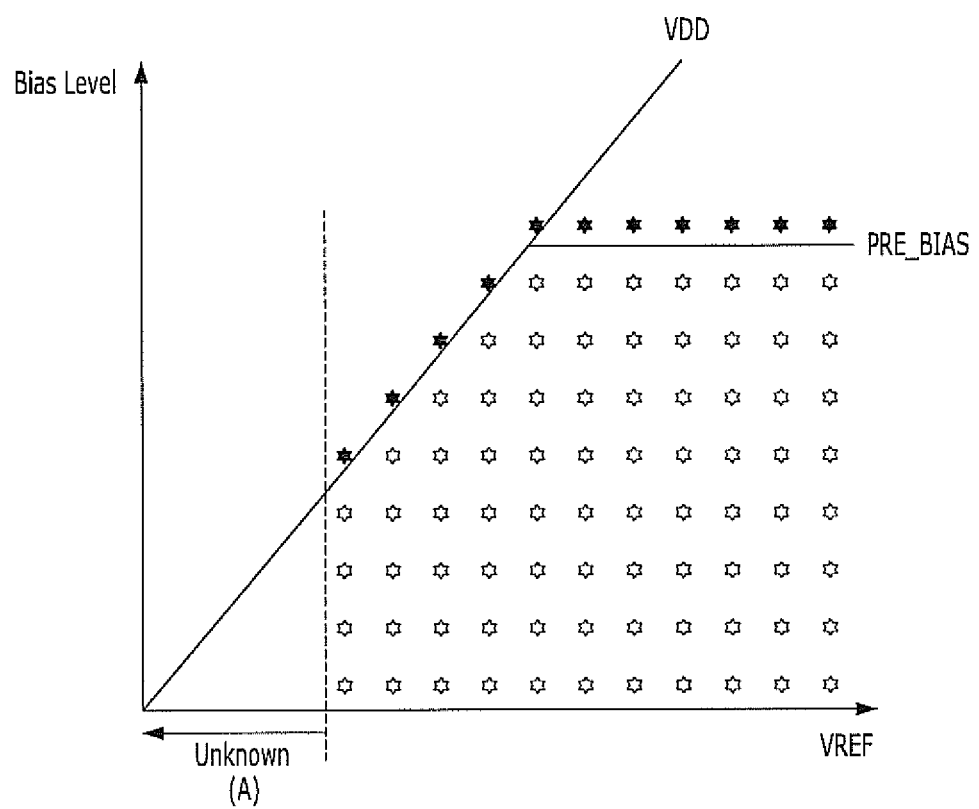

FIGS. 8A and 8B are graphs for illustrating the operation of the comparison unit 413. FIG. 8A shows a case in which the resolution of the reference voltage VREF is high, and FIG. 8B shows a case in which the resolution of the reference voltage VREF is low. The resolution refers to a level interval at which the reference voltage VREF is varied.

Referring to FIGS. 8A and 8B, a section A indicates an initialization section in which a proper operation may not be guaranteed. Therefore, a test result for the section A may be ignored for description purposes. When a solid line PRE_BIAS corresponds to an expected voltage level during measurement of the internal voltage SEL_BIAS, white figures indicate cases in which the reference voltage VREF is lower than the internal voltage SEL_BIAS, and black figures indicate cases in which the internal voltage SEL_BIAS is lower than the reference voltage VREF. Therefore, the relation between the internal voltage SEL_BIAS and the reference voltage VREF may be set in such a manner that the boundary between the white figures and the black figures becomes the voltage level of the internal voltage SEL_BIAS. At this time, the logic level of the output information VOUT outputted from the comparison unit 413 transits.

Here, when the resolution of the reference voltage VREF is high as shown in FIG. 8A, the voltage level of the internal voltage SEL_BIAS may be measured more precisely. However, the test time for measuring the voltage level of the internal voltage SEL_BIAS increases. On the other hand, when the resolution of the reference voltage VREF is low as shown in FIG. 8B, the test time for measuring the voltage level of the internal voltage SEL_BIAS may be reduced, but there is a limitation in precisely measuring the voltage level of the internal voltage SEL_BIAS.

Meanwhile, the test device supplies the reference voltage VREF corresponding to the internal voltage selected between the first and second internal voltages Vol_A and Vol_B. That is, the test device supplies the reference voltage VREF varied within a first critical range in response to the first internal voltage Vol_A, when measuring the first internal voltage Vol_A, and supplies the reference voltage VREF varied within a second critical range in response to the second internal voltage Vol_B, when measuring the second internal voltage Vol_B.

In accordance with the first embodiment of the present invention, the internal voltages Vol_A and Vol_B generated from the first and second slave chips 420 and 430 may be measured from the outside, even after the first and second slave chips 420 and 430 are stacked.

Figure 9:
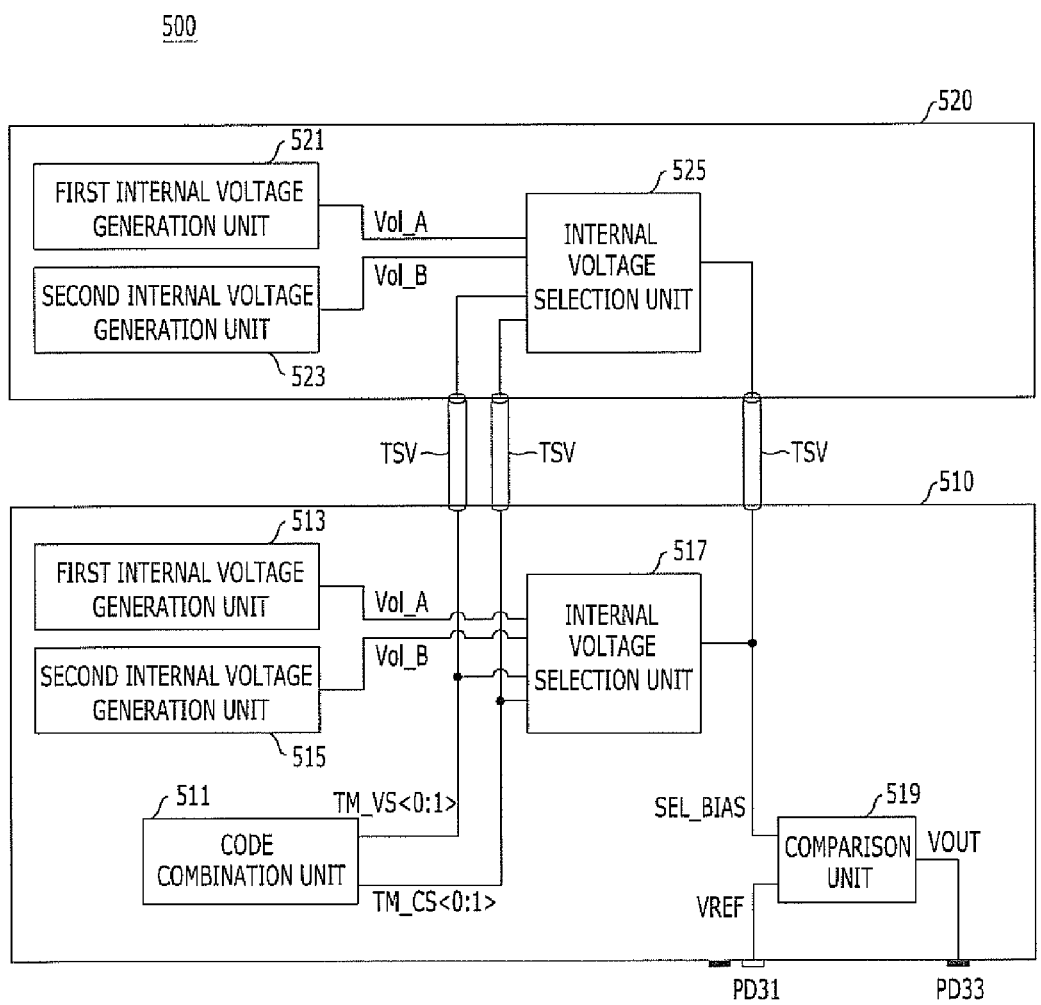
FIG. 9 is a block diagram of a semiconductor integrated circuit in accordance with a second embodiment of the present invention.

FIG. 9 is a block configuration diagram of a semiconductor integrated circuit in accordance with a second embodiment of the present invention.

In the second embodiment of the present invention, a master chip includes first and second internal voltage generation units provided in a slave chip. Accordingly, for description purposes, it is described as an example that the semiconductor integrated circuit includes one master chip and one slave chip stacked vertically over the master chip, and each of the master chip and the slave chip generates two internal voltages. At this time, the semiconductor integrated circuit in accordance with the second embodiment of the present invention has a structure in which the internal voltages generated by the maser chip and the slave chip are not shared between the chips. Here, a structure of sharing the internal voltages refers to a structure in which the internal voltages generated from the respective chips are connected through a bias mesh or a structure in which an internal voltage is generated from one given chip and then provided to the other chip.

Referring to FIG. 9, the master chip 510 includes a code combination unit 511, first and second internal voltage generation units 513 and 515, an internal voltage selection unit 517, a first pad PD31, a comparison unit 519, and a second pad PD33. The code combination unit 511 is configured to generate first and second internal voltage select signals TM_VS<0:1> and first and second chip select signals TM_CS<0:1> through a combination using at least one of an address and command. The first and second internal voltage generation units 513 and 515 are configured to generate first and second internal voltages Vol_A and Vol_B. The internal voltage selection unit 517 is configured to select one of the first and second internal voltages Vol_A and Vol_B generated by the first and second internal voltage generation units 513 and 515 in response to the first and second internal voltage select signals TM_VS<0:1> and provide the selected internal voltage SEL_BIAS to the comparison unit 519 in response to the first and second chip select signals TM_CS<0:1>. The first pad PD31 is configured to receive a reference voltage VREF from a test device (not illustrated). The comparison unit 519 is configured to compare the reference voltage VREF with the internal voltage SEL_BIAS provided from the master chip 510 or the slave chip 520 and generate result information VOUT corresponding to the comparison result. The second pad PD33 is configured to provide the result information VOUT outputted from the comparison unit 413 to the test device.

The slave chip 520 includes first and second internal voltage generation units 521 and 523 and an internal voltage selection unit 525. The first and second internal voltage generation units 521 and 523 are configured to generate the first and second internal voltages Vol_A and Vol_B. The internal voltage selection unit 525 is configured to select one of the first and second internal voltages Vol_A and Vol_B generated by the first and second internal voltage generation units 521 and 523 in response to the first and second internal voltage select signals TM_VS<0:1> and provide the selected internal voltage SEL_BIAS to the master chip 510 in response to the first and second chip select signals TM_CS<0:1>. Furthermore, the slave chip 520 includes a plurality of TSVs formed vertically therethrough and configured to transmit the first and second internal voltage select signals TM_VS<0:1>, the first and second chip select signals TM_CS<0:1>, and the internal voltage SEL_BIAS. For reference, the first and second internal voltages Vol_A and Vol_B generated by the master chip 510 and the slave chip 520 have the same voltage level.

Since the detailed descriptions of the configurations and operations of the respective components are the same as the first embodiment of the present invention (refer to FIGS. 5 to 8B), the detailed descriptions are omitted in the second embodiment of the present invention.

Figure 10:
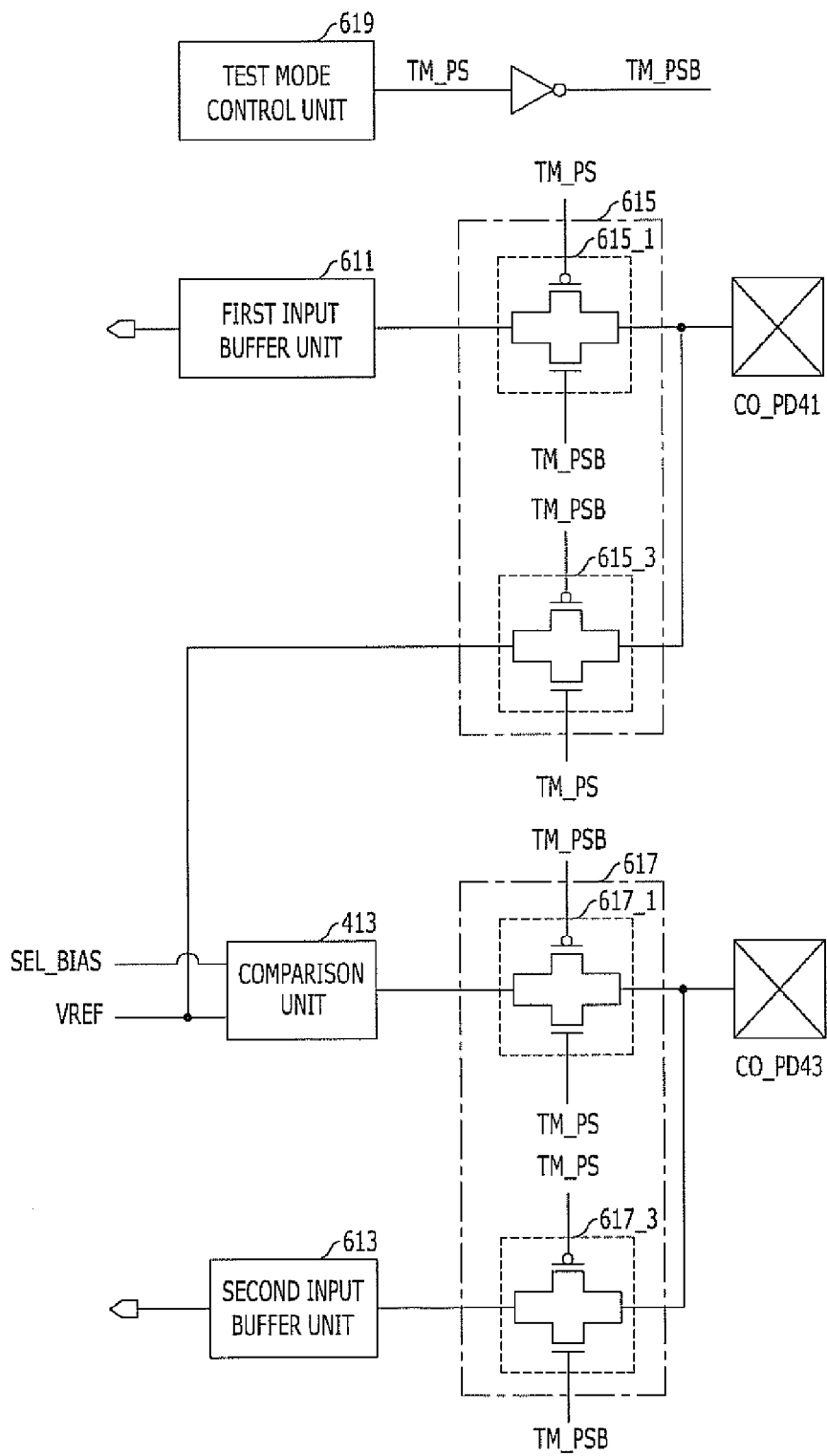
FIG. 10 is a block diagram of a semiconductor integrated circuit in accordance with a third embodiment of the present invention.

FIG. 10 is a block configuration diagram of a semiconductor integrated circuit in accordance with a third embodiment of the present invention.

The semiconductor integrated circuit in accordance with the third embodiment of the present invention includes all the characteristic components of the semiconductor integrated circuits in accordance with the first and second embodiments of the present invention. Furthermore, the third embodiment of the present invention provides a scheme capable of minimizing an area, compared to the first and second embodiments of the present invention. For description purposes, the third embodiment of the present invention will be described in comparison with the first embodiment of the present invention. Therefore, the following descriptions will be focused on components which are added in comparison with the first embodiment of the present invention, and like reference numerals will be given to the same components as those of the first embodiment of the present invention.

Referring to FIG. 10, a master chip 610 includes a first common pad CO_PD41, a comparison unit 413, a second common pad CO_PD43, a first input buffer unit 611, a second input buffer unit 613, a first path selection unit 615, a second path selection unit 617, and a test mode control unit 619. The first common pad CO_PD41 is configured to receive a first signal from an external controller (not illustrated) during a normal mode and receive a reference voltage VREF from a test device during a test mode. The comparison unit 413 is configured to compare the reference voltage VREF with an internal voltage SEL_BIAS provided from a first or second slave chip 420 or 430 during the test mode. The second common pad CO_PD43 is configured to provide an output signal VOUT of the comparison unit 413 to the test device during the test mode and receive a second signal from the external controller during a normal mode. The first input buffer unit 611 is configured to buffer the first signal during the normal mode. The second input buffer unit 613 is configured to buffer the second signal during a normal mode. The first path selection unit 615 is configured to selectively connect one of the first input buffer unit 611 and the comparison unit 413 to the first common pad CO_PD41 in response to test mode signals TM_PS and TM_PSB. The second path selection unit 617 is configured to selectively connect one of the second input buffer unit 613 and the comparison unit 413 to the second common pad CO_PD43 in response to the test mode signals TM_PS and TM_PSB. The test mode control unit 619 is configured to generate the test mode signals TM_PS and TM_PSB through a combination using at least one of an address and command.

Here, the first and second common pads CO_PD41 and CO_PD43 refer to pads provided to receive given signals, for example, a command signal, an address signal, data and the like during the normal mode. In addition to the input pads, output pads may be used as the first and second common pads CO_PD41 and CO_PD43.

Meanwhile, the first path selection unit 615 includes a fourth switching section 615_1 and a fifth switching section 615_3. The fourth switching section 615_1 is configured to selectively connect the first input buffer unit 611 and the first common pad CO_PD41 in response to the test mode signals TM_PS and TM_PSB. The fifth switching section 615_3 is configured to selectively connect the comparison unit 413 and the first common pad CO_PD41 in response to the test mode signals TM_PS and TM_PSB. Furthermore, the second path selection unit 617 includes a sixth switching section 617_1 and a seventh switching section 617_3. The sixth switching section 617_1 is configured to selectively connect the comparison unit 413 and the second common pad CO_PD43 in response to the test mode signals TM_PS and TM_PSB. The seventh switching section 617_3 is configured to selectively connect the second input buffer 613 and the second common pad CO_PD43 in response to the test mode signals TM_PS and TM_PSB. The fourth to seventh switching sections 615_1, 615_3, 617_1, and 617_3 may include transmission gates.

Hereinafter, a method for measuring an internal voltage of a semiconductor integrated circuit in accordance with the third embodiment of the present invention will be described.

When the semiconductor integrated circuit enters the test mode, the test mode control unit 619 activates the test mode signals TM_PS and TM_PSB through a combination using at least one of given address and command. Accordingly, the first path selection unit 615 electrically connects the comparison unit 413 and the first common pad CO_PD41 in response to the test mode signals TM_PS and TM_PSB, and the second path selection unit 617 electrically connects the comparison unit 413 and the second common pad CO_PD43. At this time, the first input buffer unit 611 and the first common pad CO_PD41 are electrically disconnected by the first path selection unit 615, and the second input buffer unit 613 and the second common pad CO_PD43 are electrically disconnected by the second path selection unit 617.

In such a state, the master chip 610 measures the internal voltages Vol_A and Vol_B generated by the first and second slave chips 420 and 430, using the reference voltage VREF applied through the first common pad CO_PD41 from the test device, and provides the result information VOUT to the test device through the second common pad CO_PD43. Since the method for measuring the internal voltages Vol_A and Vol_B generated by the first and second slave chips 420 and 430 under the control of the master chip 610 is the same as the first embodiment of the present invention, the detailed descriptions thereof are omitted herein.

Meanwhile, when the semiconductor integrated circuit enters the normal mode, the test mode control unit 619 deactivates the test mode signals TM_PS and TM_PSB. Therefore, the first path selection unit 615 electrically connects the first input buffer unit 611 and the first common pad CO_PD41, and the second path selection unit 617 electrically connects the second input buffer unit 613 and the second common pad CO_PD43. Furthermore, the comparison unit 613 and the first common pad CO_PD41 are electrically disconnected by the first path selection unit 615, and the comparison unit 613 and the second common pad CO_PD43 are electrically disconnected by the second selection unit 617.

The semiconductor integrated circuit in accordance with the embodiment of the present invention may utilize the pads used during the normal mode as pads for receiving the reference voltage VREF and outputting the result information VOUT during the test mode, without providing additional pads. Therefore the area may be reduced.

In accordance with the embodiment of the present invention, it is provided a scheme capable of testing internal voltages of semiconductor chips after stack packaging, in consideration of the possibility that defects which do not occur or are already screened in a wafer state of the semiconductor chips may occur through the stack packaging process of the semiconductor chips in the semiconductor integrated circuit.

Therefore, since defects of the stack-packaged semiconductor integrated circuit may be minimized, a high-quality product may be provided. Furthermore, by determining which process a defect occurred, it is easy to handle the defect.

Meanwhile, as the pad used during the normal mode is utilized during the test mode, the area of the semiconductor integrated circuit may be minimized.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit, comprising:
at least one second semiconductor chip configured to generate an internal voltage; and
a first semiconductor chip comprising:
a monitoring unit configured to monitor the internal voltage provided from the at least one second semiconductor chip; and
a first pad configured to provide monitoring result information output from the monitoring unit to a test device,
wherein the at least one second semiconductor chip is stacked over the first semiconductor chip which is electrically connected to the at least one second semiconductor chip by using through-chip vias.

2. The semiconductor integrated circuit of claim 1, wherein the second semiconductor chip comprises a plurality of semiconductor chips configured to generate and use respective internal voltages.

3. The semiconductor integrated circuit of claim 1, wherein the monitoring unit comprises a comparator configured to compare a reference voltage received from the test device with the internal voltage and output the monitoring result information corresponding to the comparison result.

4. The semiconductor integrated circuit of claim 3, wherein the first semiconductor chip further comprises a second pad configured to receive the reference voltage from the test device.

5. A semiconductor integrated circuit, comprising
at least one second semiconductor chip configured to generate different internal voltages and select the different internal voltages in response to an internal voltage select signal; and
a first semiconductor chip configured to generate the internal voltage select signal in response to at least one of an address and a command and monitor the selected internal voltage provided from the at least one second semiconductor chip to output result information corresponding to the monitoring result,
wherein the at least one second semiconductor chip is stacked over the first semiconductor chip which is electrically connected to the at least one second semiconductor chip by using through-chip vias.

6. The semiconductor integrated circuit of claim 5, wherein the second semiconductor chip comprises:
a plurality of internal voltage generation units configured to generate the different internal voltages, respectively; and
an internal voltage selection unit configured to select one of the different internal voltages in response to the internal voltage select signal and provide the selected internal voltage to the first semiconductor chip.

7. The semiconductor integrated circuit of claim 5, wherein the first semiconductor chip comprises:
a code combination unit configured to generate the internal voltage select signal through a combination using the at least one of an address and a command; and
a monitoring unit configured to monitor the selected internal voltage and generate the result information corresponding to the monitoring result.

8. The semiconductor integrated circuit of claim 7, wherein the first semiconductor chip further comprises:
a first pad configured to provide the result information to a test device; and
a second pad configured to receive a reference voltage from the test device.

9. The semiconductor integrated circuit of claim 8, wherein the monitoring unit comprises a comparator configured to compare the reference voltage with the selected internal voltage and output the result information corresponding to the comparison result.

10. The semiconductor integrated circuit of claim 6, wherein the second semiconductor chip further comprises a plurality of through chip vias (TCVs) formed to penetrate the second semiconductor chip, and
wherein the plurality of TCVs are configured to transmit the internal voltage select signal and the selected internal voltage between the first and second semiconductor chip.

11. A semiconductor integrated circuit, comprising
at least one slave chip configured to generate internal voltages and transmit the internal voltages through a plurality of through chip vias (TCVs) formed by penetrating the slave chip; and
a master chip configured to monitor the internal voltages provided from the at least one slave chip and generate result information corresponding to the monitoring result,
wherein the at least one slave chip is stacked over the master chip which is electrically coupled to the at least one slave chip by the TCVs.

12. The semiconductor integrated circuit of claim 11, wherein the slave chip comprises:
a plurality of internal voltage generation units configured to generate the internal voltages, respectively; and
an internal voltage selection unit configured to select one of the internal voltages in response to an internal voltage select signal and provide the selected internal voltage to the master chip in response to a chip select signal.

13. The semiconductor integrated circuit of claim 12, wherein the master chip comprises:
a code combination unit configured to generate the internal voltage select signal and the chip select signal in response to at least one of an address and a command and provide the internal voltage select signal and the chip select signal to the slave chip through the TCVs; and
a comparison unit configured to compare a reference voltage with the selected internal voltage provided from the slave chip and output the result information corresponding to the comparison result.

14. The semiconductor integrated circuit of claim 13, wherein the master chip further comprises:
a first pad configured to receive the reference voltage from a test device; and
a second pad configured to provide the result information to the test device.

15. The semiconductor integrated circuit of claim 13, wherein the master chip further comprises:
a plurality of internal voltage generation units configured to generate internal voltages, respectively; and
an internal voltage selection unit configured to select one of the internal voltages generated from the respective internal voltage generation units included in the master chip in response to the internal voltage select signal and provide the selected internal voltage to the comparison unit in response to the chip select signal.

16. A semiconductor integrated circuit, comprising:
a first semiconductor chip configured to be selectively connected to an external controller and a test device; and
a plurality of second semiconductor chips stacked with the first semiconductor chip and configured to generate internal voltages under a control of the first semiconductor chip,
wherein the first semiconductor chip comprises:
a first pad configured to exchange a first signal with the external controller during a normal mode and receive a reference voltage from the test device during a test mode;
a comparison unit configured to compare the reference voltage with the internal voltages provided from the second semiconductor chips during the test mode;
a second pad configured to provide an output signal of the comparison unit to the test device during the test mode and exchange a second signal with the external controller during the normal mode;
a first path selection unit configured to selectively connect the comparison unit to the first pad in response to a test mode signal; and
a second path selection unit configured to selectively connect the comparison unit to the second pad in response to the test mode signal.

17. The semiconductor integrated circuit of claim 16, wherein the first semiconductor chip further comprises a test mode control unit configured to generate the test mode signal through a combination using at least one of an address and a command.

18. A method for measuring an internal voltage of a semiconductor integrated circuit which includes a plurality of semiconductor chips configured to generate respective internal voltages and stacked vertically, the method comprising:
providing an internal voltage generated by a second semiconductor chip of the semiconductor chips to a first semiconductor chip of the semiconductor chips during a test mode; and
in the first semiconductor chip, comparing the internal voltage of the second semiconductor chip provided from the second semiconductor chip to a reference voltage applied from a test device, and providing result information corresponding to the comparison result to the test device.

19. The method of claim 18, wherein the reference voltage is varied by a set level within a critical range in response to the result information.

20. The method of claim 18, wherein the providing of the internal voltage comprises:
transmitting control signals from the first semiconductor chip to the other semiconductor chips through a plurality of through chip vias (TCVs) to select the second semiconductor chip; and
transmitting the internal voltage generated by the second semiconductor chip to the first semiconductor chip through the TCVs.

* * * * *